United States Patent [19]

Griffiths

[11] 4,095,997

[45] Jun. 20, 1978

[54] COMBINED SOLAR CELL AND HOT AIR COLLECTOR APPARATUS

[76] Inventor: Kenneth F. Griffiths, 31 London Ter., New Rochelle, N.Y. 10804

[21] Appl. No.: 730,361

[22] Filed: Oct. 7, 1976

[51] Int. Cl.² ............................................. H01L 31/04
[52] U.S. Cl. .............................. 136/89 HY; 126/270; 136/89 H; 136/89 PC
[58] Field of Search ............ 136/89 HY, 89 PC, 89 P, 136/89 H; 126/270

[56] References Cited

U.S. PATENT DOCUMENTS

| | | | |
|---|---|---|---|
| 2,888,007 | 5/1959 | Tabor | 126/270 |
| 2,946,945 | 7/1960 | Regnier et al. | 320/2 |
| 2,989,575 | 6/1961 | Wallace, Jr. | 136/89 |
| 3,116,171 | 12/1963 | Nielsen et al. | 136/89 |
| 3,866,285 | 2/1975 | Clark | 29/157 R |
| 3,985,116 | 10/1976 | Kapany | 126/270 |

OTHER PUBLICATIONS

D. G. Scheuler et al., "Integration of Photovoltaic & Solar-Thermal Energy Conversion Systems," Conf. Record, 11th IEEE Photospecialists Conf., May 6-8, 1975, pp. 327-331.

*Primary Examiner*—Aaron Weisstuch

[57] ABSTRACT

A solar collector having at least one solar cell, an air retaining plate located parallel to and immediately behind the unlit side of the cell. A plate is spaced from the back of the cell to permit passage of substantially all the air that is to be treated by the cell, the retaining plate being in communication with the portion of the collector through which the air is withdrawn.

14 Claims, 3 Drawing Figures

COMBINED SOLAR CELL AND HOT AIR COLLECTOR APPARATUS

BACKGROUND OF THE INVENTION

The present invention relates to solar energy systems and in particular to collectors for the heating of air and simultaneous production of electric power through photovoltaic effect.

The production of direct current electric power from suitable photovoltaic solar cells is a well known art. For example, the use of silicon cells for producing electric power for space vehicles has been very successful. One commercial system involves the use of a thin film of such high photo active material as copper-sulphide or cadmium-sulphide deposited on the lower inside surface of a hermetically sealed, double panel glass panel. When such a panel intercepts sunlight, the photovoltaic film is able to convert as much as 7% of the sunlight falling upon the panel into useful electric power.

Solar cells also convert sunlight into heat, as well as electric energy. Therefore, heat as well as electric energy can be a useful product from a system of one or more solar cells.

It is well known that the efficiency of electric power production for almost all types of photovoltaic electric cells is increased by keeping the temperature of the photovoltaic material as low as possible. On the other hand, in cases in which hot air is to be obtained for such applications as heating domestic hot water and space heating of buildings, it is desirable to produce the air at a reasonably high temperature such as 160° or even 200° F. In general these two criteria are opposites of each other and there is not known any successful system in which the optimum production of electricity and heat are simultaneously obtained.

In conventional cases in which the heat by-product from solar cells would be utilized to heat air, the cells would comprise the hot sunlit cover of a suitable collection box and cold air would usually be allowed to enter the box at one end and heated air would leave the other end, passing through the spaces between the individual solar cells. In the use of such a box, heat would be transferred to the air inside mostly by radiation from the hot underside of the cells, and a large temperature difference would exist between the cooler air temperature in the box and the hot backside of the solar cells because of poor heat transfer between the backside and the air in the box. All of this results in an excessively high temperature for the solar cells and above all would be contrary to efficient conversion of sunlight into electricity.

It is the object of the present invention to provide a combined solar air heating collector and solar energy electric power cell which primarily converts a maximum percentage of the intercepted sunlight energy into useful electric power and at the same time produces as a by-product the hottest air possible.

It is a further object of the present invention to increase as much as possible the efficiency of transferring heat from a solar electric power cell to a stream of flowing air, and to lower as much as possible the capital cost per square foot of fabricated material which is used to augment efficient heat transfer from a solar cell to flowing air. It is another object of the present invention to produce the hottest air possible with photovoltaic cells while still maintaining an acceptably low temperature of the photovoltaic material within the cell, as well as to effect the most efficient low cost cooling of photovoltaic electric cells.

These objects, together with other objects and advantages of the present invention will be apparent from the following disclosure.

SUMMARY OF THE INVENTION

According to the present invention, the rate of heat transfer between the hot outer surface of a solar cell and air to be heated by that cell is greatly augmented by providing an air retaining plate which is located parallel to and immediately behind the unlighted backside of the cell. This plate need not be transparent; however, a space is left between the plate and the back of the cell of just sufficient width to permit passage of substantially all of the air to be heated by that cell. Also, means are provided for allowing unheated air to enter this space and means for withdrawing heated air from another portion of this space. Usually, unheated air is drawn into this space at the sides of the cell and heated air is discharged from the space through a suitable opening at another location under the cell.

As a result, the solar cells may be photovoltaic cells mounted in a rectangular open box housing and each cell is provided with an air retaining plate located parallel to and immediately under its unlit backside to form a slot therewith and, having means to allow cold air to enter the slot between the plate and the cell and means for discharging heated air from this slot. In many cases, this heated air would be collected in a suitable hot air collection manifold. When such a manifold would be used, the air slots immediately adjacent to any surface of the cells would be narrow enough to insure that the air velocity in those slots would be much greater than in the manifold. However, these slots should not be so narrow that an unreasonable amount of pressure would be required to force air through the slots into the manifold. When such a manifold would be used, it is preferred that all of the cold air entering the housing would do so through the slots. As a result of such forced passage of air a lower and a more uniform temperature is maintained over all surfaces of the cell.

Full details of the present invention are set forth in the following disclosure, and are shown in the accompanying drawing.

DESCRIPTION OF THE INVENTION

Figure 1:
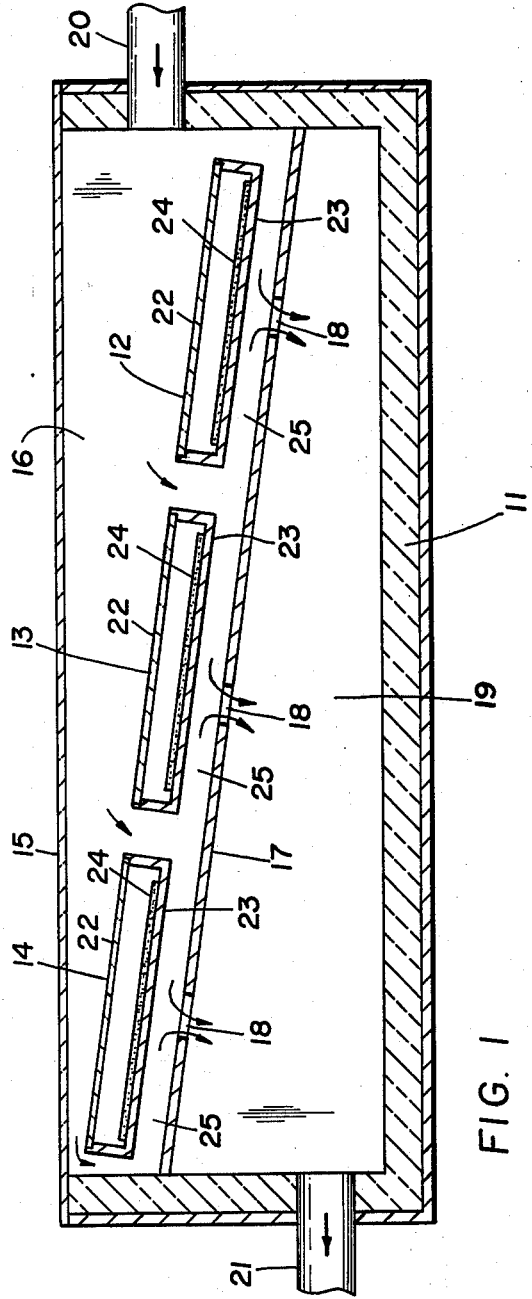
FIG. 1 is a sectional view along the longitudinal axis of a solar collector embodying the present invention.

Referring to FIG. 1, a solar collector 11 is provided having an array of three solar cells 12, 13 and 14 aligned in spaced stepped relationship. The body of collector 11 may consist of an open top box fabricated of a rigid thermal insulation material such as urethane foam board having a transparent cover 15. The cover is utilized to protect the solar cells from adverse weather and serves as a cover for the space above the cells which form an air distribution manifold 16. Supported below the cells 12, 13 and 14, is an air retaining plate 17. The cells are substantially of coextensive width with the frame and may be supported angular to the horizontal axis, by brackets engaging their ends secured to the side walls of the frame or they may be supported on plate 17 by screws, brackets, clips or the like not shown in the drawings. The plate 17 is unitary and extends below all three cells. The backside of each cell is parallel to and slightly above the top surface of plate 17. An air exit opening 18 is provided in plate 17 below the center of each cell to allow heated air to pass downward into the space between the plate 17 and the bottom of the box, forming a hot air collection manifold 19.

The cold air distribution manifold 16 located above the solar cells 12, 13 and 14 is fed relatively cool air through conduit 20 while the hot air collected in manifold 19 located under air retaining plate 17 is discharged from conduit 21. Preferably the discharge is effected as a result of the air flow caused by the heating of the air in the collector, although the use of blowers, fans or the like could be made.

Heat transfer between the hot backside of a solar photo-voltaic cell and an airstream flowing under it and above an air retaining plate may be enhanced by a metal finned heat dissipator. Such a dissipator may consist of a metal plate which would have metal fins or prongs projecting outward from one of its surfaces. The other surface of the dissipator may be flat and be placed against the flat unlighted backside of a photovoltaic cell. A suitable cement, which would have a high coefficient of thermal conductivity, may be used to thermally bond the heat dissipator to the backside of the cell. The height to which the fins or prongs would project outward from the plate which supports them would be sufficient to enable them to reach substantially into the slot, and just sufficient to contact the air retaining plate. Therefore, all of the air flowing in the slot would flow in close proximity to the fins or prongs. Naturally, the heat dissipator would be preferably fabricated out of a metal, such as aluminum or copper which has a high coefficient of thermal conductivity.

The production of electric current from sunlight is possible by forming each of the cells 12, 13 and 14 as an enclosed somewhat flat hollow rectangular box having a transparent upper face 22 and a transparent lower face 23 on which a film 23 of photo-voltaic material such as silicon, copper sulphide or cadmium sulphide is spread. The cells are each spaced above the distribution plate 17 to provide a small slot 25 in communication with the openings 18. Suitable contacts, in accordance with known technology are provided, but not shown, in the drawings by which the current created in the cell is tapped.

When the solar collector shown in FIG. 1 is operating, sunlight passes through transparent cover 15 and the top glass layer 22 of each cell. This sunlight then impinges upon and is absorbed in photovoltaic material comprising film 24. The heat generated in this film is conducted downward through the lower glass plate 23 in each cell and is dissipated to the slot 25.

Cold air from inlet 20 passes downward along the edges of each cell to the slot 25 under each cell where it travels laterally to the opening 18 under each cell. This air is heated as it travels laterally through the slot under each cell and is fully heated by the time it passes out of openings 18. Preferably, the path of lateral air flow under each cell is such that it passes in contact with all portions of the backside of the cell so that simultaneously with its heating it effectively cools the cell about its entire surface. Such distribution of air flow under each cell is important to reduce the chances of any hot spots forming in any portion of any cell.

In some cases, the cold unheated air may be passed directly from the ambient surroundings onto each of the cells without the use of inlet and outlet conduits which establish the air flow. Thus the transparent cover 15 could be eliminated. This would allow slightly more light to reach film 24 but would prevent the collector from being able to utilize anything but ambient air as feed to the air heating slots.

Figure 2:
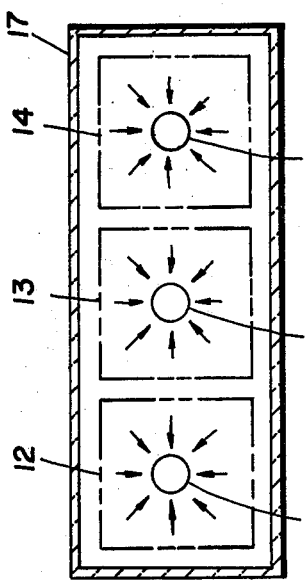
FIG. 2 is a sectional view along line 2—2 of FIG. 1 showing a top planar view of the air distribution plate within the collector.

In FIG. 2 the movement of air over air distribution and heat retaining plate 17 is shown. The dotted lines show the edges of the solar cells 12, 13 and 14 which are located above the plate 17. Cooling air flows through the slot beneath each cell in a generally radial direction shown by the arrows toward the central location of the opening 18.

Figure 3:
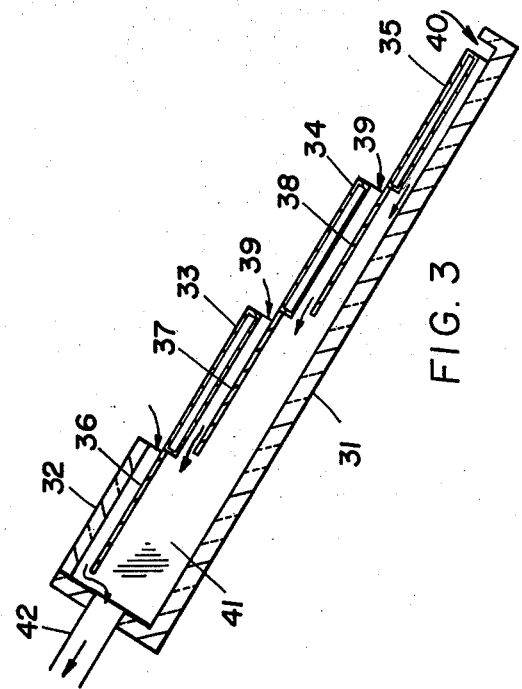
FIG. 3 is a vertical section of another collector embodying the present invention.

In FIG. 3, a solar collector 31 is shown, provided with an array of four photovoltaic solar cells 32, 33, 34 and 35, which are slightly different from those of FIG. 1. These cells may be mounted on and be supported in a suitable frame, which may be shaped like a box and may be fabricated of a stiff, boardlike thermal insulation, such as composition board, e.g. masonite, or rigid urethane foam. The central plane of each cell is shown to be parallel to that of every other cell in the array. However, these cells may be staggered along the depth of the frame, from front to rear, as they are located from the bottom to top of the frame. Extending from each cell 33, 34 and 35 except the upper one 32, there is a flat, stationary, air retaining and distributing plate 36, 37 and 38, respectively, which is parallel to and is located just under the lower surface of the cell immediately above it to extend under its entire backside and form a narrow slot 39 sufficient to provide relatively high air velocity through it but not so narrow as to necessitate excessive pressure to drive air through it. The uppermost cell 32 of course is not provided with an air retaining or distributing plate since there is no adjacent cell. Similarly, because of the absence of an adjacent cell to the lowermost cell 35, the retaining and distributing plate 17 is secured to the bottom wall of the frame 31. Each of the other air retaining plates is preferably integrally or unitarily attached to the upper edge of the associated cell below it in such a manner that air would not short circuit between it and the cell to which it is attached. The lowermost cell 35 is spaced from the bottom edge of the frame to provide an air inlet corresponding to the inlets between the stepped cells, for relatively cool air, to pass through the slots 39 into a hot air collection manifold 41 defined by the bottom wall of the frame and the cells. Preferably, all of the air which enters hot air collection manifold 41 should do so through the slots under each of the four cells. Heated air is withdrawn from manifold 41 through conduit 40 by means which would maintain manifold 41 at a lower pressure than that outside of the cells. A blower or even naturally induced thermal draft is such suitable means.

Cells 32, 33, 34 and 35 may be any suitable type which is able to generate electric power from sunlight and be fabricated in the form of a relatively flat sheet. The cells shown in FIG. 1 may be used. The air retaining plates may be of any relatively stiff material such as metal, fiberboard or even glass.

The advantage of the inclined step arrangement of cells and air retaining plates shown in FIG. 3 is that rain or snow would not tend to enter the air slots and the air collection manifold.

For example, a solar collector arranged as shown in either FIG. 1 or FIG. 3 may be provided with photovoltaic cells, one foot by one foot square of double paned, hermetically sealed, glass construction with a photovoltaic film of copper sulphide, cadmium sulphide of suitable construction on the inside surface of the lower glass pane. The air retaining plate may be aluminum and approximately ⅛ inch of space may be provided between the upper surface of each aluminum plate and the lower surface of the cell immediately above it. The frame is fabricated of 2-inch thick urethane foam board. A blower and a suitable damper are provided to introduce and/or exhaust air from the manifold at a controlled flowrate.

In FIG. 3, the total surface area of cells exposed to sunlight is four square feet and when the solar collector is placed in bright sunlight which is nearly perpendicular to the exposed surface of the cells and the blower is turned on and the damper is adjusted to allow 12 cubic feet per minute of air to flow through the slots and out of the manifold 41, the air velocity through the slots averages about 5 feet per second. As a result, heat transfer from the bottom of each cell to the flowing air is good and the pressure drop of the air flowing through the slots is reasonably small. After the system had been working for the better part of one hour, thermal equilibrium is generally established. Under thermal equilibrium conditions, ambient air at 70° F. flowing into the slots is heated to 160° F. by the time it entered the hot air manifold 41. The temperature of each of the cells stayed below 200° F.

It is contemplated that, in some instances, a collector may have its hot air exhaust conduit 40 connected with a suitable chimney or stack. This stack, which is not shown in FIG. 3, may be used to maintain a lower pressure in the air collection manifold than in the space immediately in front of the photovoltaic cells. Such a stack may be used particularly in situations in which the heated air would be used only for the purpose of generating a draft to help cool the cells. Such a system as this may be of advantage in cases in which mirrors may be used to concentrate sunlight upon the cells. In such a case, efficient air cooling of banks of cells without the use of power blowers to pump air would be of great advantage. The use of the stack of heated air serves very nicely to move air through the slots without the use of powered blowers or fans. The use of this system may be highly advantageous in desert areas where:

- there would be no use of the heated air by-product;
- it would be advantageous to increase the electric output of each square foot of cells by mirrors or other light concentrating means without overheating the cells;
- it would not be economical to use any electric power to move air which would be utilized to cool the photovoltaic cells;
- the increased electric output per square foot of cell would more than offset the added cost of air collection manifold and vertical draft generating stacks. In this case, probably no thermal insulation would be used for the manifold walls or the stack; or
- electric power production would be the only desired product and the air slots, the air collection manifold and the stacks would serve only for cooling the cells.

In cases in which a stack is used to augment air draft through the slots, the stack need be only sufficiently high to generate an air velocity in the range of 5 to 25 feet per second through the slots. The height of the stack top above the highest cells in the air manifold may be as little as 20 feet or be as much as 200 feet. This height may depend upon such considerations as the size and shape of the array of cells, the size and shape of the air collection manifold, the desired air velocity through the slots, and the desired flow rate of air per square foot of cell surface, and the intensity of sunlight (amount of concentration) upon the sunlit surface of the cells.

In cases in which a stack is used and the warm air rising in the stack serves to produce a draft, a generous flow-rate of air may be allowed through each slot to lower the average temperature of the cells as much as possible. On the other hand, the flow rate of air through the slots should not be so great as to decrease the temperature in the stack to the point where the pressure drop through the slots would be too small. In most cases, the flow rate of air in the slots is self-regulating and depends principally on the height of the stack and the width of the slots. The higher the stack and the wider the slots, the greater the flow rate of air through the system per square foot of cell area, the cooler the cells and the less is the temperature difference between the air in the stack and the ambient air outside. Therefore, for any given system, the selection of the optimum stack height, slot width, arrangement of the array of cells, the amount of concentration of sunlight upon the cells and the type of metal dissipators to be used on the unlit sides of the cells is easily determined by heat transfer engineers.

It will be seen from the foregoing that in either of the embodiments, it is possible to enhance the heat transfer between the cells and the flowing air by the provision of the heat retaining plate. This plate effectively divides the collector frame in two, so that the air may be caused to flow in sufficient volume over the cells, and through the area of highest heat (i.e., the slot 25 or 39) so that efficient transfer of all of the heat into all of the flowing air is obtained while simultaneously isolating the cells from the hot air manifold section. The retaining plate, as indicated, provides a large surface for dissipation of heat to the moving stream below the cell. It will be thus appreciated that while the present invention can be employed with any cell, it has particular application in combination with photovoltaic cells.

What is claimed:

1. A solar collector comprising a frome having a bottom wall and side walls defining a partially enclosed space, a heat producing solar cell located within the frame and having one side exposed for illumination, said solar cell being mounted to permit flow of air therearound within the space, an air retaining plate mounted beneath the unlit side of said solar cell and spaced therefrom to provide a slot for movement of air therebetween, said plate being spaced from the bottom wall of said frame to define therewith a sub-space for the retention of air therein, and an outlet in said frame in communication with the sub-space for the removal of air retained therein.

2. The collector according to claim 1 wherein said solar cell is photovoltaic.

3. The collector according to claim 1, wherein said plate is substantially coextensive with said frame and is provided with at least one hole through which air flows from said slot to said outlet of said frame.

4. The collector according to claim 3, wherein said plate defines with the bottom wall of said frame a substantially enclosed heat storage area in communication with said outlet of said frame.

5. The collector according to claim 1 including a plurality of solar cells arranged in stepped relationship to each other with a plate associated with each solar cell, each plate secured from and extended in the plane of the adjacent cell beneath the cell with which it is associated.

6. The collector according to claim 5, wherein said plates are integrally formed with said cells from which they extend.

7. The collector according to claim 1, including a plurality of solar cells arranged in a generally common plane above said plate and to substantially fill the area within the side walls of said frame.

8. A solar collector comprising a frame formed as a substantially rectangular open box having bottom and side walls partially enclosing a space, at least one solar cell mounted within said space, and arranged in a plane set on an angle to the bottom wall to define a cool air zone above said cells and a warm air zone below said cells, an inlet for cool air passing through at least one side wall in communicaion with said cool air zone and an outlet passing through at least one side wall in communication with said warm air zone, means located beneath each of said at least one cell for retaining at least in part the heat produced therein, said means being spaced from said at least one cell to permit air to pass beneath said at least one cell, and arranged to permit said passing air to flow into the warm air zone.

9. The collector according to claim 8, wherein said means for retaining the heat comprises a heat reflective plate made of an air impermeable material having a plurality of holes therein.

10. The collector according to claim 8, wherein said holes are arranged substantially at the center of the respective cells.

11. The collector according to claim 8, wherein said means for retaining the heat comprises a foraminous plate.

12. The collector according to claim 8, wherein said cells are arranged in a stepped relationship staggered in the direction with respect to the bottom wall, and said heat retaining means comprises a plate made of air impermeable material coextensive and associated respectively with each of said cells, the plate associated with one cell being attached to the next adjacent cell except for the last cell in said arrangement.

13. The collector according to claim 8, including a transparent cover for said frame.

14. The collector according to claim 8 including means for maintaining the warm air zone at a pressure less than the cool air zone.

* * * * *